United States Patent
de Obaldia et al.

(10) Patent No.: US 7,813,462 B2
(45) Date of Patent: Oct. 12, 2010

(54) METHOD OF DEFINING SEMICONDUCTOR FABRICATION PROCESS UTILIZING TRANSISTOR INVERTER DELAY PERIOD

(75) Inventors: Elida Isabel de Obaldia, Dallas, TX (US); Robert B. Staszewski, Garland, TX (US); Dirk Leipold, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 944 days.

(21) Appl. No.: 11/550,878

(22) Filed: Oct. 19, 2006

(65) Prior Publication Data

US 2007/0110194 A1    May 17, 2007

Related U.S. Application Data

(60) Provisional application No. 60/728,395, filed on Oct. 19, 2005.

(51) Int. Cl.
   *H03D 3/24* (2006.01)
(52) U.S. Cl. .................. 375/376; 375/346; 375/373; 375/375; 326/46
(58) Field of Classification Search ................. 375/376, 375/345, 346, 375; 326/46
   See application file for complete search history.

(56) References Cited

U.S. PATENT DOCUMENTS

| | | | | |
|---|---|---|---|---|
| 6,593,773 | B2 * | 7/2003 | Staszewski et al. | 326/46 |
| 2002/0191727 | A1 * | 12/2002 | Staszewski et al. | 375/376 |
| 2003/0133522 | A1 | 7/2003 | Staszewski et al. | |
| 2006/0033582 | A1 | 2/2006 | Staszewski et al. | |
| 2006/0038710 | A1 | 2/2006 | Staszewski et al. | |

OTHER PUBLICATIONS

R. B. Staszewski et al., "All-Digitial PLL and GSM/EDGE Transmitter in 90nm CMOS," IEEE International Solid-State Circuits Conference, Feb. 2005, pp. 316-217, 600.

R. B. Staszewski et al., "A Digitally Controlled Oscillator in a 90 nm Digital CMOS Process for Mobile Phones," IEEE Journal of Solid-State Circuits, vol. 40, No. 11, Nov. 2005, pp. 2203-2211.

R. B. Staszewski et al., "All-Digital PLL and Transmitter for Mobile Phones," IEEE Journal of Solid-State Circuits, vol. 40, No. 12, Dec. 2005, pp. 2469-2482.

C. H. Hung et al., "A Digitally Controlled Oscillator System for SAW-Less Transmitters in Cellular Handsets," IEEE Journal of Solid-State Circuits, vol. 41, No. 5, May 2006, pp. 1160-1170.

(Continued)

*Primary Examiner*—Phuong Phu
(74) *Attorney, Agent, or Firm*—Frederick J. Telecky, Jr.; Wade J. Brady, III

(57) ABSTRACT

A novel method and apparatus for defining process variation in a digital RF processor (DRP). The invention is well suited for use in highly integrated system on a chip (SoC) radio solutions that incorporate a very large amount of digital logic circuitry. The method and apparatus provide direct measurement of fabrication process variation in circuits without requiring any additional test equipment by utilizing a time to digital converter (TDC) circuit already present in the chip. The TDC circuit relies on the time delay in an inverter chain to sample a high speed CKV clock using a slow FREF clock. Calculation of inverse time provides a direct correlation for fabrication process variation in each die.

11 Claims, 8 Drawing Sheets

OTHER PUBLICATIONS

K. Muhammad et al., "The First Fully Integrated Quad-Band GSM/GPRS Receiver in a 90-nm Digital CMOS Process," IEEE Journal of Solid-State Circuits, vol. 41, No. 8, Aug. 2006, pp. 1772-1783.

Y. C. Ho et al. "Charge-Domain Signal Processing of Direct RF Sampling Mixer with Discrete-Time FIlters in Bluetooth and GSM Receivers," EURASIP Journal on Wireless Communications and Networking, vol. 2006, Article 62905, pp. 1-14.

M. Nakai et al., "Dynamic Voltage and Frequency Management for a Low-Power Embedded Microprocessor," IEEE Journal of Solid-State Circuits, vol. 40, No. 18, Jan. 2006, pp. 28-35.

* cited by examiner

METHOD OF DEFINING SEMICONDUCTOR FABRICATION PROCESS UTILIZING TRANSISTOR INVERTER DELAY PERIOD

REFERENCE TO PRIORITY APPLICATION

This application claims priority to U.S. Provisional Application Ser. No. 60/728,395, filed Oct. 19, 2005, entitled "Fab process definition by calculating transistor invert delay period with TDC," incorporated herein by reference in its entirety.

FIELD OF THE INVENTION

The present invention relates to the field of data communications and more particularly relates to a method for defining the semiconductor fabrication process by measuring inverter delay.

BACKGROUND OF THE INVENTION

Complementary Metal Oxide Semiconductor (CMOS) technology has recently evolved, in terms of both frequency and noise, where it is increasingly being used in radio frequency (RF) applications in the GHz frequency range. Currently, cutoff frequencies of over 50 GHz have been reported for 0.18 µm CMOS technology and are expected to reach as high as 100 GHz as feature size shrinks to 100 nm. This translates into CMOS circuit operating frequencies well into the GHz range, which covers the frequency range of numerous wireless products in use today, such as mobile phones, Global Positioning System (GPS), Bluetooth.

The large interest in RF CMOS is due to the advantages of using CMOS technology in terms of production cost, high-level integration and the ability to combine digital, analog and RF circuits on the same integrated circuit (IC) (i.e. chip).

Another application of RF CMOS is in the fabrication of Digital RF Processors or Digital Radio Processors (DRP). In the fabrication of DRPs and other CMOS ICs it is well known that process variation in the core transistor for RF-CMOS technology results from minute inherent inconsistencies among chips made even within a single batch made from a few wafers or even a single wafer. This variation presents a particularly vexing challenge for designers of highly integrated "systems on a chip" (SoC). Knowing the process corner for each die makes it possible for the designer to compensate for the RF/analog performance differences by "dialing" the correct setting for parameters that affect device performance. At present, the extent of process variation in a design is inferred, rather than directly observed, by measuring some analog parameter of the wafer, such as current or gain. Typically, the process variation is indirectly measured by physically probing several test pads placed at different locations on the wafer and measuring a current which is closely associated to an RF parameter.

Unfortunately, indirect and external measurement to deduce process variation requires additional costly equipment and steps in the manufacturing process resulting in longer test times and significantly higher costs. Using an external test equipment would be inconvenient or impossible at certain stages of IC lifecycle, such as after the IC is assembled or in customer hands.

In addition to the process corner effect on the performance of RF, analog and digital circuits, the temperature and voltage also have significant effects. However, the voltage and temperature changes are considered environmental and are variable in comparison to the relatively static process corner characteristics.

Therefore, it is desirable to have a mechanism that is capable of measuring the process corner for each die on a semiconductor wafer that doe not require additional equipment and lengthy test times as is the case with prior art solutions. The mechanism should be relatively easy to implement, incur minimal testing time and cost while enabling compensation of system performance by configuring correct parameter settings for each individual chip die. It would also be desirable to track the voltage and temperature effects on the circuit performance after manufacture.

SUMMARY OF THE INVENTION

The present invention provides a solution to the problems of the prior art by providing a process variation measurement mechanism that is operative to directly measure the process comer of an integrated circuit die being fabricated. Circuitry adapted to implement the mechanism of the present invention is fabricated directly on the integrated circuit chip.

The process comer measurement mechanism of the present invention is adapted to share the same circuitry already used to implement a time to digital converter (TDC). The mechanism involves making a direct internal measurement of the inverter delay in the TDC circuit and does not require any additional test equipment.

The TDC is a component in the ADPLL that functions to measure the fractional time delay difference between a slow reference clock (e.g., 26 MHz) and the next rising edge of a much faster RF oscillator clock (~1-2 GHz). The process variation measurement mechanism of the present invention is operative to make double use of the TDC circuit to not only measure the fractional time delay between the two clocks but also to measure the process variation of the die the TDC circuit is fabricated on. The temperature and voltage effects, if other than their nominal values, are also accounted for.

To effect a process comer measurement, a "TDC normalization" sequence is set up to start the period inversion calculation of the TDC circuit in the ADPLL, which is normally done based on measurements of the fractional time delay difference between the reference clock and the next rising edge of the RF oscillator clock. The TDC uses a slow clock (FREF) to sample a high speed clock (CKV). The loop is set to accumulate and average the fractional delay between FREF and CKV and has a resolution of a single inverter delay. A register that contains the number of inverters required to match the re-timing of FREF is read. This value is translated to the inverter delay period of the transistor, which determines the speed of the transistor as correlated to the process strength.

As compared to when wafers processes had been measured using prior art methods, using the information provided by the inverter delay was found to be directly proportional to the process variation of the tested core transistors, in examples where channel dimension variation was known to correspond to transistor strength. Knowing how the process varies, allows adjustments to be made in the application software to improve the silicon performance.

For example, in a process which appears to suffer from a weak NMOS, compensation might be achieved using one or more of the following techniques: (1) adjusting the bias current to fine-tune LNA gain; (2) increasing the voltage of low-dropout regulators (LDOs); (3) adjusting the setting of the ADC to optimize the noise performance; (4) adjusting the bandwidth of the loop filter to optimize phase noise performance; and (5) adjusting the RF power output control.

Furthermore, instead of making a judgment as to the quality of a batch of dies or chips based on externally measuring as few as a single chip from a wafer, the process definition reader and process defining method taught herein enable plotting the observed period inversion of each chip and comparing it to the desired period inversions as determined by measuring it against a chip of known strength. Essentially any DRP chip incorporating some form of the TDC circuit disclosed, i.e. which provides period inversion data, can be process defined by the reader and method disclosed herein. Further, the particular "process strength" of each die as determined by the invention can be fused permanently into the chip making it available throughout the life of the chip.

The process variation definition is further coupled with on chip temperature detection to optimize the RF/analog performance and to compensate for temperature effects. This can be accomplished using look up tables or algorithms running on the SoC processor.

Several advantages of the process corner measurement of the present invention include: (1) direct measurement of the transition delay (which is inversely proportional to the period inversion) of the core NMOS/PMOS transistor-based inverter used in the chip; (2) transition delay is proportional to the NMOS and PMOS process strength; (3) no external equipment is required to perform this measurement as it is already implemented in the ADPLL circuit; and (4) the process knowledge is used to take full advantage of the software controlled radio (i.e. DRP) by providing the basis for process parameter compensation.

There is thus provided in accordance with the present invention, a method of compensating an analog circuit for integrated circuit process variation, the method comprising the steps of measuring a time delay of an inverter fabricated on the integrated circuit and adjusting settings of the analog circuit in accordance with the measured time delay.

There is also provided in accordance with the present invention, a method of compensating a plurality of analog and radio frequency (RF) circuits for integrated circuit process variation, the method comprising the steps of measuring a time delay of an inverter fabricated on the integrated circuit, generating a digital indication of process variation corresponding to the time delay, permanently burning the digital indication into the integrated circuit and reading the digital indication and adjusting settings of the analog and RF circuits in accordance with the digital indication.

There is further provided in accordance with the present invention, a System on a Chip (SoC) comprising an inverter chain fabricated on the SoC, a time delay measurement circuit operative to measure a cell time delay of the inverter chain, a burn in circuit operative to generate a digital indication of process variation corresponding to the time delay and to permanently burn the digital indication into the SoC, means for retrieving the burned-in digital indication of process variation and means for periodically obtaining updated time delay measurements from the time delay measurement circuit and for comparing the updated time delay measurements with previous time delay measurements to yield an indication of current temperature therefrom.

There is also provided in accordance with the present invention, a process strength measurement device comprising an inverter chain normally operative to determine a delay difference between a reference clock and a high speed clock, a normalization circuit operative to accumulate the delay difference over a plurality of reference clock cycles to yield an average delay difference and means for calculating a measure of process strength as a function of the average fractional delay difference.

There is further provided in accordance with the present invention, an apparatus for measuring process variation in an all digital phase locked loop (ADPLL) comprising a time to digital converter (TDC) circuit comprising a chain of inverters operative to generate a plurality of clock delay difference measurements and means for generating an indication of process strength as a function of the plurality of clock delay difference measurements.

There is also provided in accordance with the present invention, an apparatus for measuring process variation in a digital signal processor (DSP) having a clock retiming circuit including inverters and registers for comparing a system clock and a reference clock, wherein the apparatus reads the registers in the clock retiming circuit, determines the inverse of the clock adjustment provided by the clock retiming circuit, and outputs retiming data which directly correlates with process variation of the DSP.

There is further provided in accordance with the present invention, an apparatus for measuring process variation in a digital RF processor (DRP) having a clock retiming circuit including an inverter chain and corresponding registers for comparing a system clock and a reference clock, wherein the apparatus reads the registers in the clock retiming circuit and determines an inverter delay therefrom, and outputs retiming data which is directly proportional to process variation of core transistors making up the DRP.

There is also provided in accordance with the present invention, a method of directly measuring process variation in a device incorporating a time to digital converter (TDC) circuit, the method comprising the steps of determining a number of transistors activated in a chain of inverters which matches the retiming of an external reference clock, translating the number of transistors activated to an inverter delay period corresponding to the transistors and correlating the inverter delay period to yield a measurement of process variation.

There is further provided in accordance with the present invention, a method of compensating performance of an analog circuit fabricated on an integrated circuit for variations in fabrication process technology, the method comprising the steps of measuring a statistic of a circuit fabricated on the integrated circuit and unrelated to the analog circuit and adjusting settings of the analog circuit in accordance with the measured statistic.

Note that many aspects of the invention described herein may be constructed as software objects that are executed in embedded devices as firmware, software objects that are executed as part of a software application on either an embedded or non-embedded computer system running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

BRIEF DESCRIPTION OF THE DRAWINGS

The invention is herein described, by way of example only, with reference to the accompanying drawings, wherein.

DETAILED DESCRIPTION OF THE INVENTION

Notation Used throughout

Figure 1:
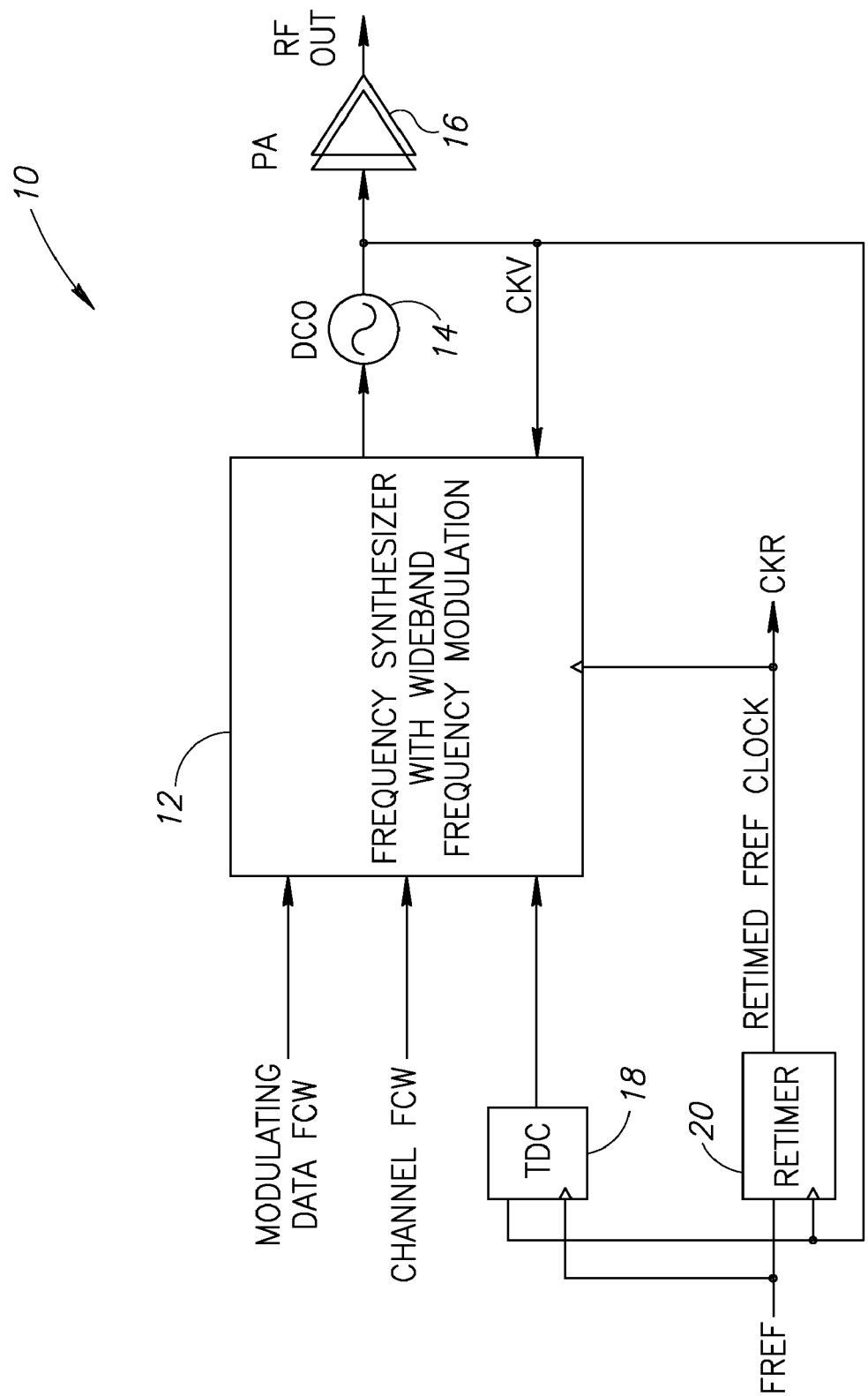
FIG. 1 is a simplified block diagram illustrating an all digital phase locked loop (ADPLL) and polar transmitter of the present invention.

The following notation is used throughout this document.

| Term | Definition |
| --- | --- |
| ACW | Amplitude Control Word |
| ADC | Analog to Digital Converter |
| ADPLL | All Digital Phase Locked Loop |
| AM | Amplitude Modulation |
| ASIC | Application Specific Integrated Circuit |
| CDMA | Code Division Multiple Access |
| CKR | Retimed Reference Clock |
| CKV | Variable Oscillator Clock |
| CMOS | Complementary Metal Oxide Semiconductor |
| DAC | Digital to Analog Converter |
| DCO | Digital Controlled Oscillator |
| DCS | Digital Communication Services |
| DCXO | Digitally Controlled Crystal Oscillator |
| DEM | Dynamic Element Matching |
| DOE | Design of Experiments |
| DRP | Digital RF Processor or Digital Radio Processor |
| DSP | Digital Signal Processor |
| FCW | Frequency Command Word |
| FPGA | Field Programmable Gate Array |
| FREF | Frequency Reference |
| GSM | Global System for Mobile Communication |
| HB | High Band |
| HDL | Hardware Description Language |
| IC | Integrated Circuit |
| IF | Intermediate Frequency |
| IIR | Infinite Impulse Response |
| LB | Low Band |
| LDO | Low Drop Out regulator |
| LNA | Low Noise Amplifier |
| LO | Local Oscillator |
| LUT | Look Up Table |
| PA | Power Amplifier |
| PCB | Printed Circuit Board |
| PCS | Personal Communication Service |
| PLL | Phase Locked Loop |
| PVT | Process, Voltage, Temperature |
| RF | Radio Frequency |
| RMS | Root Mean Square |
| SoC | System on Chip |
| TA | Transconductance Amplifier |
| TDC | Time to Digital Converter |
| VCO | Voltage Controlled Oscillator |
| WCDMA | Wideband Code Division Multiple Access |

DETAILED DESCRIPTION OF THE INVENTION

The present invention is a mechanism for semiconductor fabrication process corner measurement and related applications thereof. The invention utilizes the TDC circuitry already present in the ADPLL circuit used in implementing a digital radio transmitter and receiver but can be used in other applications as well, such as a general communication channel. The present invention provides a solution to the problem of measuring semiconductor process variation by taking advantage of the correlation between process variation and period inversion as measured by the TDC circuit.

To aid in understanding the principles of the present invention, the description is provided in the context of a digital RF processor (DRP) transmitter and receiver that may be adapted to comply with a particular wireless communications standard such as GSM, Bluetooth, WCDMA, etc. It is appreciated, however, that the invention is not limited to use with any particular communication standard and may be used in optical, wired and wireless applications. Further, the invention is not limited to use with a specific modulation scheme but is applicable to any modulation scheme including both digital and analog modulation. The invention is applicable in situations where it is desirable to reduce the effects of process variations on analog and RF parameters that affect the overall performance of the SoC.

Note that throughout this document, the term communications device is defined as any apparatus or mechanism adapted to transmit, receive or transmit and receive data through a medium. The communications device may be adapted to communicate over any suitable medium such as RF, wireless, infrared, optical, wired, microwave, etc. In the case of wireless communications, the communications device may comprise an RF transmitter, RF receiver, RF transceiver or any combination thereof. In context of this application, the terms RF circuit and analog circuit are used interchangeably. It should also be noted that the invention is also applicable to semiconductor devices for applications other than communications.

The notation DRP is intended to denote either a Digital RF Processor or Digital Radio Processor. References to a Digital RF Processor infer a reference to a Digital Radio Processor and vice versa.

ADPLL and TDC Circuit Overview

A brief overview of the operation of the ADPLL and TDC circuits are provided here for the benefit of the reader. A more detailed description of the operation of the TDC and ADPLL circuits can be found in U.S. application Ser. No. 11/062,254, filed Feb. 18, 2005, entitled "Apparatus For and Method of Noise Suppression and Dithering to Improve Resolution Quality in a Digital RF Processor," incorporated herein by reference in its entirety.

A clock retiming and synchronization scheme is operative to retime the frequency reference source such that its clock edges are aligned (with possible fixed offset) with the RF oscillator clock edges. A block diagram illustrating the noise suppression scheme as applied to an example ADPLL based DRP transmitter is shown in FIG. 1. The transmitter portion of the DRP, generally referenced 10, comprises a digital logic portion of a frequency synthesizer with wideband frequency modulation capability 12, digitally controlled oscillator (DCO) 14, power amplifier (PA) 16, retiming element (flip flop or register) 20 and time to digital converter (TDC) 18. For clarity sake, the blocks that are not critical to the clock retiming and synchronization are merged into the frequency synthesizer block 12. This block comprises the reference and oscillator phase accumulators, phase detector, loop filter and normalization.

In operation, the modulating data frequency command word (FCW) and the channel FCW, both digital values, are input to the frequency synthesizer 12 which is adapted to generate a digital tuning word to the DCO. The DCO produces a digital clock CKV in the RF frequency band. The CKV clock is amplified by the PA, filtered by the PA matching network, and terminated with an antenna. In the feedback path, the CKV clock is used to retime the FREF clock. The FREF clock is the stable reference frequency clock. The FREF clock is input to the D input of a retiming element 20 (e.g., retimer, flip flop, register, etc.) and is clocked by the CKV clock. The output generated is the retimed frequency reference clock CKR. The operation of the flip flop/register serves to strip FREF of its critical timing information and generate a retimed CKR clock. It is this CKR clock that is subsequently distributed and used throughout the system. As a result of the retiming operation, the edges of the CKR clock are now synchronous with the RF oscillator clock CKV. This results in the time separation between the closest CKR and CKV edges to be time invariant.

Thus, the entire radio, including the digital RF processor, the digital baseband circuitry and the application processor, is operated in a clock synchronous mode wherein every clock in the system is either derived from or synchronized to the RF oscillator clock. Thus, the frequency reference clock is made synchronous to the oscillator clock and this retimed frequency reference clock is used to drive the entire digital logic circuitry of the SoC chip. This ensures that the different clock edges throughout the system will not exhibit mutual drift.

The CKR clock can be used to drive the digital logic since the digital logic is not sensitive to the accuracy of the edges, as long as the edges are compliant with the relevant timing specifications. In order to eliminate injection pulling effect in the entire chip, all the digital logic including DSP or other processors is adapted to operate on the CKR clock or clocks that are derived from or synchronous to the CKV clock.

Figure 2:
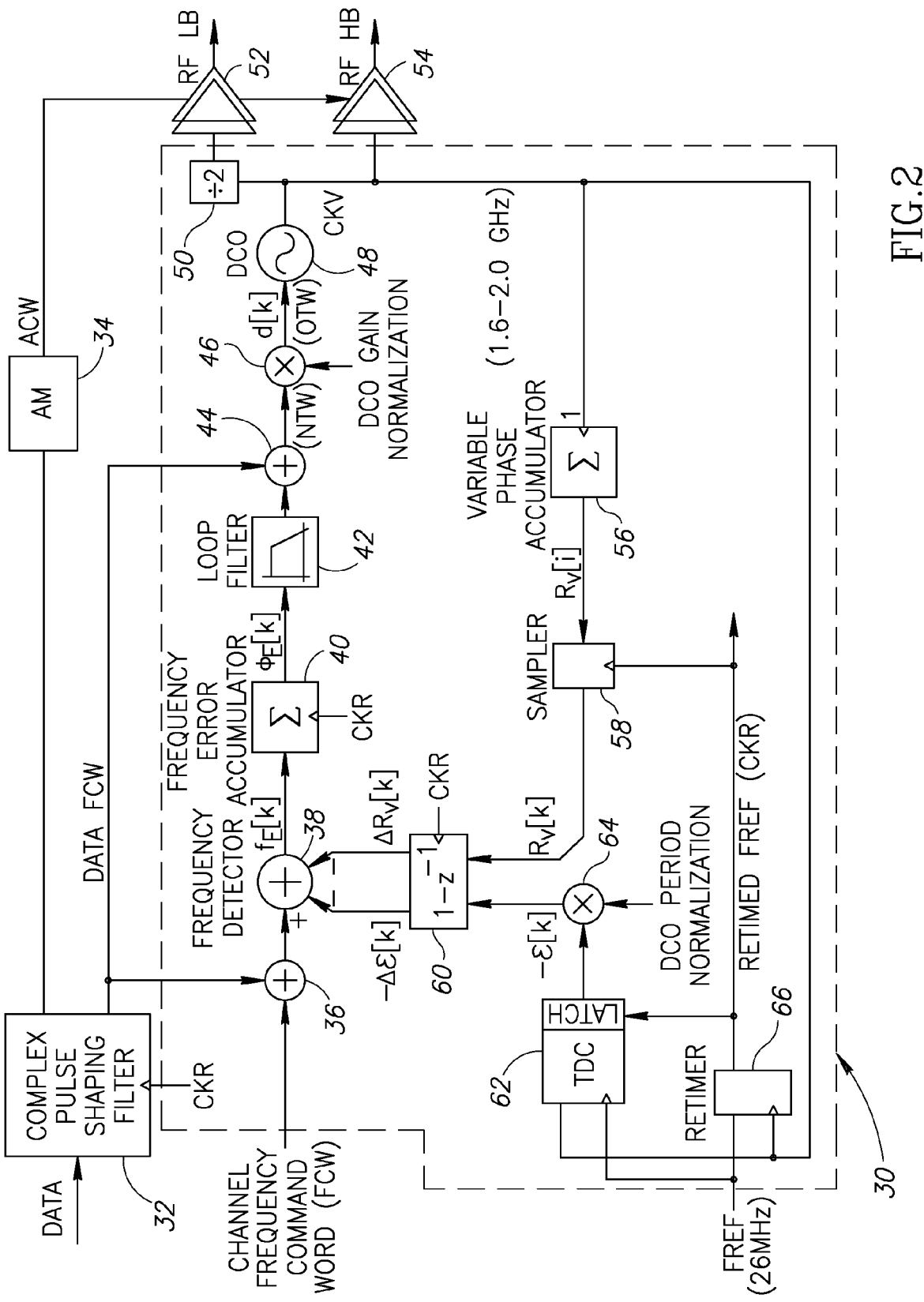
FIG. 2 is a block diagram illustrating an all digital phase locked loop (ADPLL) and polar transmitter incorporating the mechanism of the present invention.

A block diagram illustrating an all digital phase locked loop (ADPLL) and polar transmitter incorporating the mechanism of the present invention is shown in FIG. 2. Note that the clock input to the AM block may comprise CKR clock or CKV divided clock. The core of the ADPLL is a digitally controlled oscillator (DCO) 48 adapted to generate the RF oscillator clock CKV. The oscillator core (not shown) operates at twice the 1.6-2.0 GHz high band frequency, which is then divided for precise generation of RX quadrature signals. The single DCO is shared between transmit and receive and is used for both the high frequency bands (HB) and the low frequency bands (LB). An additional 4-bits of the tracking bank are dedicated for ΣΔ dithering in order to improve frequency resolution, as described in more detail infra.

The ADPLL sequencer traverses through the process, voltage, temperature (PVT) calibration and acquisition modes during channel selection and frequency locking and stays in the tracking mode during the transmission or reception of a burst. To extend the DCO range to accommodate for voltage and temperature drifts, and to allow wide frequency modulation, the coarser-step acquisition bits are engaged by subtracting an equivalent number (generally fractional) of the tracking bank varactors. The acquisition/tracking varactor frequency step calibration is performed in the background with minimal overhead using dedicated hardware. All the varactors are realized as n-poly/n-well MOSCAP devices that operate in the flat regions of their C-V curves. The new varactors and the DCO core structure result in better phase noise which is needed to meet stricter GSM requirements.

The operation of the ADPLL in the phase-domain is as follows. The variable phase of the output is digitally represented by a fixed-point concatenation of the DCO edge transition count $R_V[k]$ and the normalized time-to-digital converter (TDC) 62 output $\epsilon[k]$. As described in more detail hereinbelow, the TDC measures and quantizes the time differences between the frequency reference (FREF) and the DCO clock edges. The sampled differentiated variable phase is subtracted from the frequency command word (FCW) by the digital frequency detector 38. The frequency error $f_E[k]$ samples are accumulated via frequency error accumulator 40 to create the phase error $\phi_E[k]$ samples, which are then filtered by loop filter 42, a fourth-order IIR filter, and normalized by a proportional loop attenuator 46.

A parallel feed with coefficient p adds an integrated term to create type-II loop characteristics, which suppresses the DCO flicker noise. The IIR filter 42 is a cascade of four single stage filters, each satisfying the following $$y[k]=(1-\lambda)y[k-1]+\lambda x[k] \tag{1}$$

wherein
x[k] is the current input;
y[k] is the current output;
k is the time index;
λ is the configurable coefficient.

The 4-pole IIR filter attenuates the reference and TDC quantization noise at an 80 dB/dec slope, primarily to meet the GSM spectral mask requirements at 400 kHz offset. The phase error samples $\phi_E[k]$ are then multiplied by the $f_R/K_{DCO}$ normalization factor via multiplier 46, where $f_R$ is the reference frequency, to make the loop characteristics and modulation independent from the DCO gain $K_{DCO}$. The modulating data is injected into two points of the ADPLL to implement direct frequency modulation. A hitless gear-shifting mechanism for the dynamic loop bandwidth control serves to reduce the settling time. It changes the loop attenuator α several times during the frequency locking while adding the $(\alpha_1/\alpha_2-1)\phi_1$ DC offset to the phase error, where indices 1 and 2 denote before and after the event, respectively. Note that $\phi_1=\phi_2$ since the phase is to be continuous.

The CKV clock is retimed via retimer 66, which may comprise a flip flop or register clocked by the reference frequency FREF. The output of the retimer is the retimed reference frequency clock CKR which is distributed and used throughout the device. It is important to note that the CKR clock (i.e. fractional clock or retimed FREF clock) has the same average frequency as the original FREF clock. The retiming operation only shifts the edges of the FREF clock but their expected averaged distances are not affected. Note also that the edges of the FREF clock are always aligned with the next rising edge of the CKV clock since it an edge event cannot be re-aligned in past time, but only in future time.

Although the invention is operative to realign the FREF clock, the original frequency reference (FREF) clock is not changed. The original frequency reference clock is used to extract timing information by way of a time to digital converter (TDC).

Time to Digital Converter

The time to digital converter (TDC) is operative to determine the FREF retiming quantization error. In order to meet typical wireless standards, the nature of the DCO operation within the ADPLL calls for a relatively fine phase quantization resolution requirement. It is the role of the TDC to correct the resolution limited integer-domain quantization error by means of a fractional-period error estimator. The fractional delay difference between the frequency reference clock FREF and the next significant edge of the DCO clock CKV is measured by the TDC.

Figure 3:
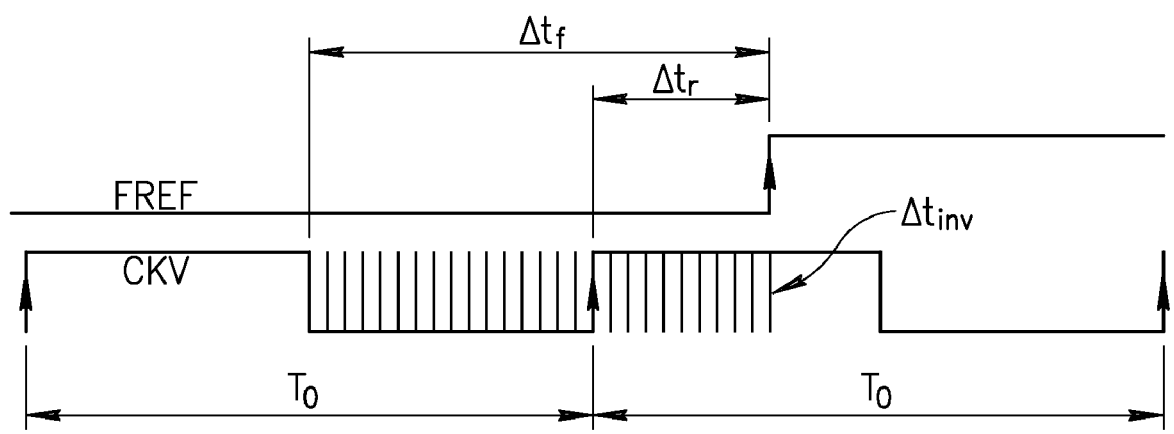
FIG. 3 is a diagram illustrating of time-to-digital converter core signals.

A diagram illustrating time-to-digital converter core signals is shown in FIG. 3. The timing separation between the rising edge of FREF and the rising edge of CKV is denoted by $t_r$ while the timing separation between the rising edge of FREF and the falling edge of CKV is denoted by $t_f$. The timing relationships $t_f$ and $t_r$ between the frequency reference FREF and CKV are illustrated in FIG. 3.

Figure 4:
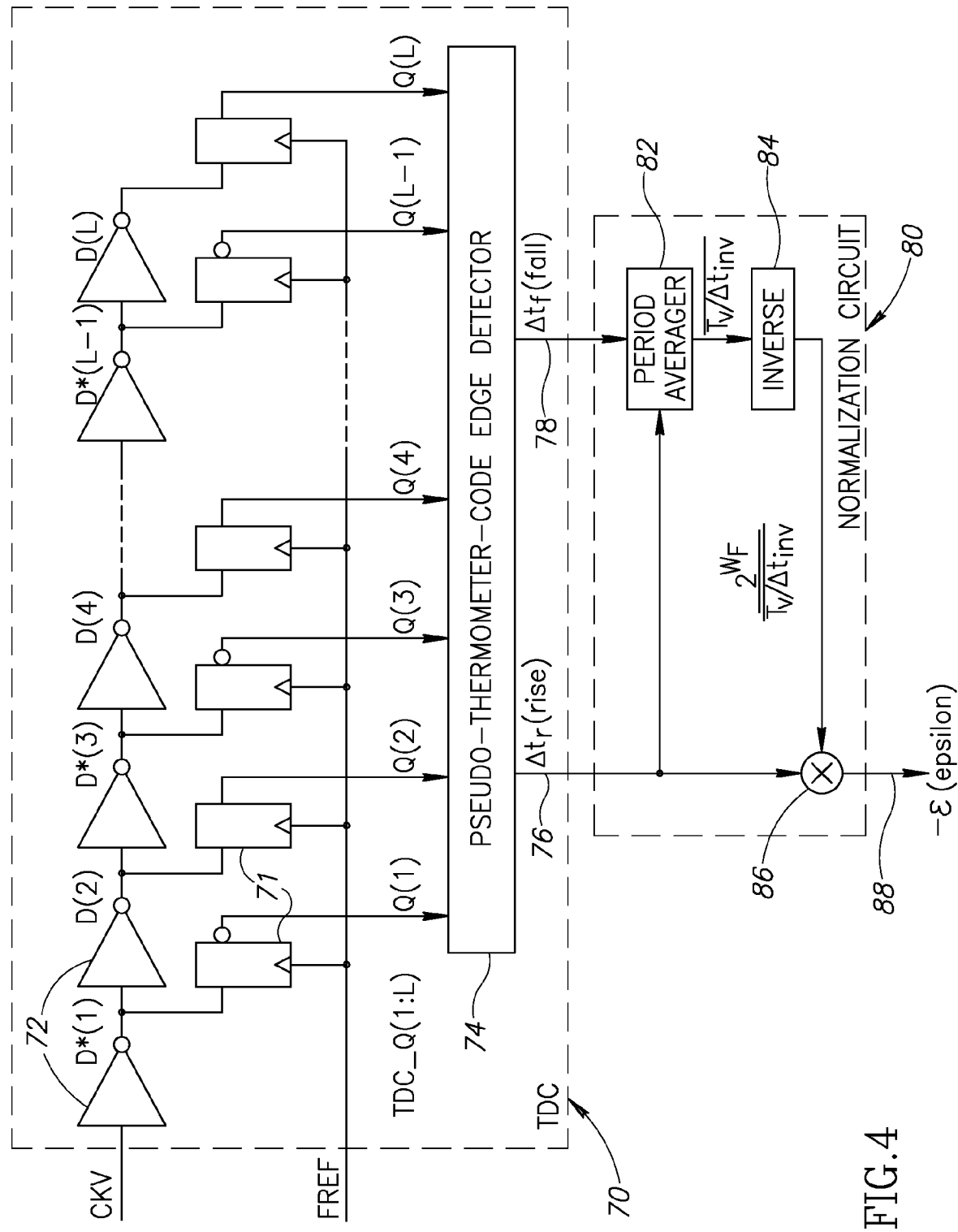
FIG. 4 is a block diagram illustrating the time to digital converter (TDC) circuit of the present invention in more detail.

A block diagram illustrating the time to digital converter (TDC) circuit of the present invention in more detail is shown in FIG. 4. A timing diagram illustrating the waveforms generated within the time to digital converter with respect to the frequency reference clock and the RF oscillator clock is shown in FIG. 5.

Figure 5:
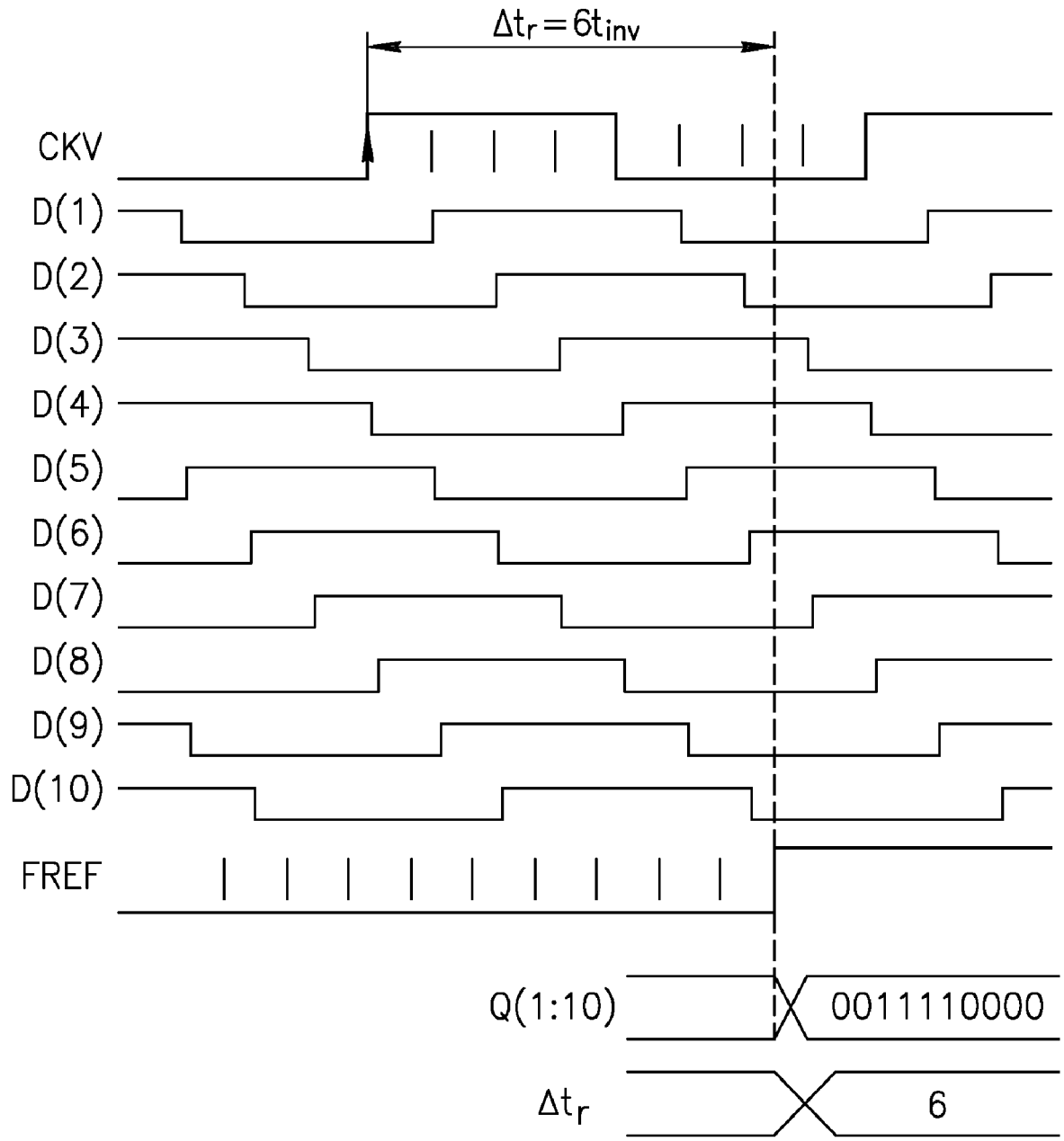
FIG. 5 is a timing diagram illustrating the waveforms generated within the time to digital converter with respect to the frequency reference clock and the RF oscillator clock.

With reference to FIGS. 4 and 5, the TDC, generally referenced 70, is constructed as an array of inverter delay elements 72 and registers 71. The delay comprises L inverters but may be modified to any length depending on the requirements of the particular application. The number of taps L required for the TDC is determined by how many inverters are needed to cover the full DCO period.

$$L \geq \frac{\max(T_V)}{\min(t_{inv})} \quad (2)$$

The digital fractional phase is determined by passing the DCO oscillator clock CKV through the chain of inverters such that each inverter output produces a clock slightly delayed from the previous inverter. The staggered clock phases D(1) through D(24) are then sampled by the same frequency reference clock FREF. This is accomplished by an array of registers whose Q and Q bar outputs, Q(1) through Q(24), form a pseudo thermometer code which is input to the pseudo-thermometer code edge detector 64. As a result of this arrangement, there will be a series of ones and zeros presented to the input of the detector 74.

In the example presented in FIG. 5, the period of the CKV clock is eight periods, i.e. $T_V=8$. There is a series of four ones which starts at position 3 and extends to position 6. The series of four zeros follow starting at index 7. The position of the detected transition from 1 to 0 indicates a quantized time delay $\Delta t_r$ from the rising edge of the DCO clock CKV to the FREF sampling edge. Similarly, the position of the detected transition from 0 to 1 indicates a quantized time delay $\Delta t_f$ from the falling edge of the DCO clock CKV to the FREF sampling edge. In this example, the pseudo thermometer code edge detector is operative to output a $\Delta t_R$ signal 76 having a value of 6. The pseudo thermometer code edge detector also outputs a $\Delta t_F$ signal 78. The $\Delta t_R$ signal represents the difference between the rising edge of FREF and the previous rising edge of CKV expressed in multiples of $t_{inv}$, the time delay of an inverter. The $\Delta t_F$ signal represents the difference between the rising edge of FREF and the previous falling edge of CKV. The $\Delta t_R$ value is subsequently normalized and used by the phase detector to correct the tuning word input to the DCO. The normalization circuit 80 comprises a period averager 82, inverse function 84 and multiplier 86. The output of the TDC is normalized by the DCO clock period $T_V$ before it is input to the PLL loop. Note that it has been found that accumulating 128 clock cycles by the averager is sufficient to produce an accuracy within 1 ps of the inverter delay $t_{inv}$.

The TDC is thus self calibrating during normal operation for the PVT inverter delay variations, as shown in FIG. 4. The absolute difference between the measured rising edge and falling edge delays of CKV to FREF ($\Delta t_r$ and $\Delta t_f$ respectively) is the half-period of CKV in terms of number of inverters, i.e. half of $T_0/\Delta t_{inv}$. An accurate estimate of $T_0/\Delta t_{inv}$ is obtained through averaging, with an error below 1%. Its inverse is used for the fixed-point period normalization multiplier with $W_F=24$ fractional bits. This value divided by the CKV frequency, $1/T_0$, constitutes the inverter delay $\Delta t_{inv}$ in units of seconds and is read out to give an indication of the CMOS process strength.

The combination of the arithmetic phase detector and the TDC can be considered a replacement of a conventional phase/frequency detector. Since all the circuitry in the ADPLL system uses the delayed, retimed version CKR of the FREF clock except for the TDC and the clock retiming circuitry, which uses the original FREF clock, there will be a quiet time period during the TDC sampling period. This mechanism thus exploits a time-causal relationship between the FREF and CKR clocks. The critical continuous-domain time-difference conversion to a digital word by the TDC is performed at the FREF edge event. The FREF clock is then resampled (i.e. retimed) by the CKV clock edges to generate the CKR clock. The digital processing of almost the entire chip, including the ADPLL, is performed at the following CKR edge event or synchronously with the other CKV events.

Thus, the digital logic circuitry on the chip is forced to be quiet at the time the FREF edge event arrives. Once the time difference has been measured by the TDC, the tens or hundreds of thousands of gates of digital circuitry can operate with the consequent noise generation from ringing, etc.

Integrated Circuit Fabrication Process Reader and Definition

In accordance with the invention, the TDC block of the ADPLL described supra, which uses a slow clock (i.e. FREF) to sample a high speed clock (i.e. CKV), is used to determine the process corner of the die. As discussed supra, the time conversion resolution is equal to an inverter propagation delay, for example 15-20 ps, depending on the particular process corner in the 90 nm CMOS technology example presented herein. The inverter propagation delay is the finest logic-level regenerative timing in CMOS. In accordance with the invention, the TDC circuit also serves as a CMOS inverter delay indicator for the purpose of inverter delay normalization, thereby also providing an indication of process strength for IC circuits in large system on chip (SoC) dies.

With reference to FIG. 4, the process corner measurement mechanism of the invention utilizes the array of inverter delay elements 72 and registers 71. The reader which comprises normalization circuit 80 is operative to take the reading from the registers 71 after processing by the pseudo-thermometer code detector 74, and apply it to the period averager 82 and inverse function 84. The inverter delay period $t_{inv}$ of the transistor produced by the inverse function 84 is proportional to the process strength to which it is correlated, thus permitting software and/or other adjustments to be made to compensate if necessary.

In operation, the timing loop is set to accumulate the fractional delay difference between FREF and CKV clocks. The resolution being a single inverter delay. To calculate the fractional difference value in picoseconds (ps) units is given by $$\text{value} = \frac{P_{INV}(\text{dec})}{2^{15}} \cdot CKV \quad (3)$$

where $P_{INV}$ is the register value that is updated after the ADPLL loop has been activated. The contents of the register comprises the number of transistors activated which matches the retiming of an external reference clock. Equation 3 above is used to translate the register contents to the inverter delay period of the transistor, which is equivalent to the speed of the transistor which is correlated with and proportional to the process strength Since the analog/RF circuit uses the same transistors and process, the process strength dictates the performance of these circuits as well.

Rather than make a judgment as to the quality of a batch of dies or chips based on externally measuring as few as a single chip from a wafer, the process definition reader and process defining method taught herein enables plotting the observed period inversion of each chip and comparing it to the desired period inversions as determined by measuring it against a chip of known strength.

Essentially any DRP chip incorporating some form of the TDC circuit disclosed, i.e. a circuit that provides period inversion data, can be process defined by the reader and method disclosed herein. The period inversion or delay information under known temperatures during probing is also "fused" such that the process characteristic is known for a particular temperature and supply voltage. This hardcoded information could be used during the life of the SoC to compensate for operational life degradation.

Further, in addition to the use of process delay information measured at time of the manufacture and burned into the chip using fuses, measurements of time delay and/or temperature using the TDC circuit can be performed on a periodic basis, e.g., once per second, minute, etc., to provide measurement data on a continual basis. The results of these periodic measurements can be used to dynamically adjust various analog portions of the SoC.

Sample Graphs of Period Inversion and Process Strength Distributions

Figure 6:
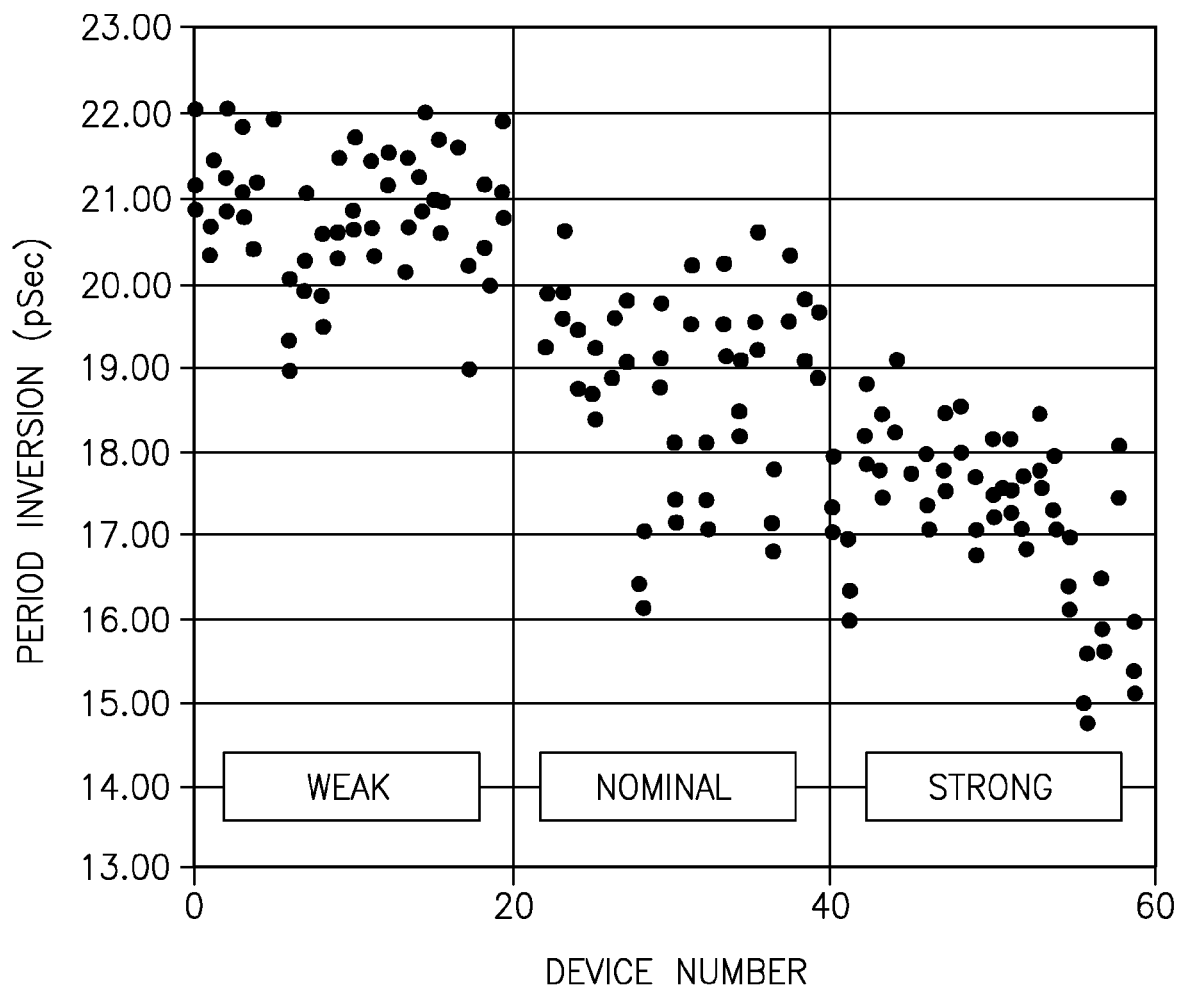
FIG. 6 is a graph illustrating an example plot showing proportionality of process variations to "period inversions" or detected inverter delay.

A graph illustrating an example plot showing the direct proportionality of process variations to period inversions is shown in FIG. 6. As seen in the example plot, once the reader determines the values of the inverter delays of the TDCs, they can be plotted against a graph in which definitions for desired thresholds have been preferably determined for baseline, strong and very strong process strength, as well as weak and very weak process strength. The inverter delay is proportional to the process variation of the core transistors.

In the graph of FIG. 6, baseline strength is indicated as those chips which have an inverter delay at or near 18 ps, based on the measurements of a control chip of known quality. Chips featuring shorter inverter delays are faster, hence strong if below 16.5-17 ps, and very strong if as low as 16 ps or less. Chips featuring longer inverter delays are slower, hence weak above about 19.5 ps and very weak above about 21 ps of period inversion.

By plotting actual readings of period inversion from each and every chip, graphical information can be generated as to where compensation for process variations is needed. Thus, using the mechanisms of the present invention, process variation information can be easily extracted thereby eliminating the need to perform any external measurements of RF parameters using a meter or other costly test equipment, a practice which can only practically be performed on a small sample of chips manufactured.

Figure 7:
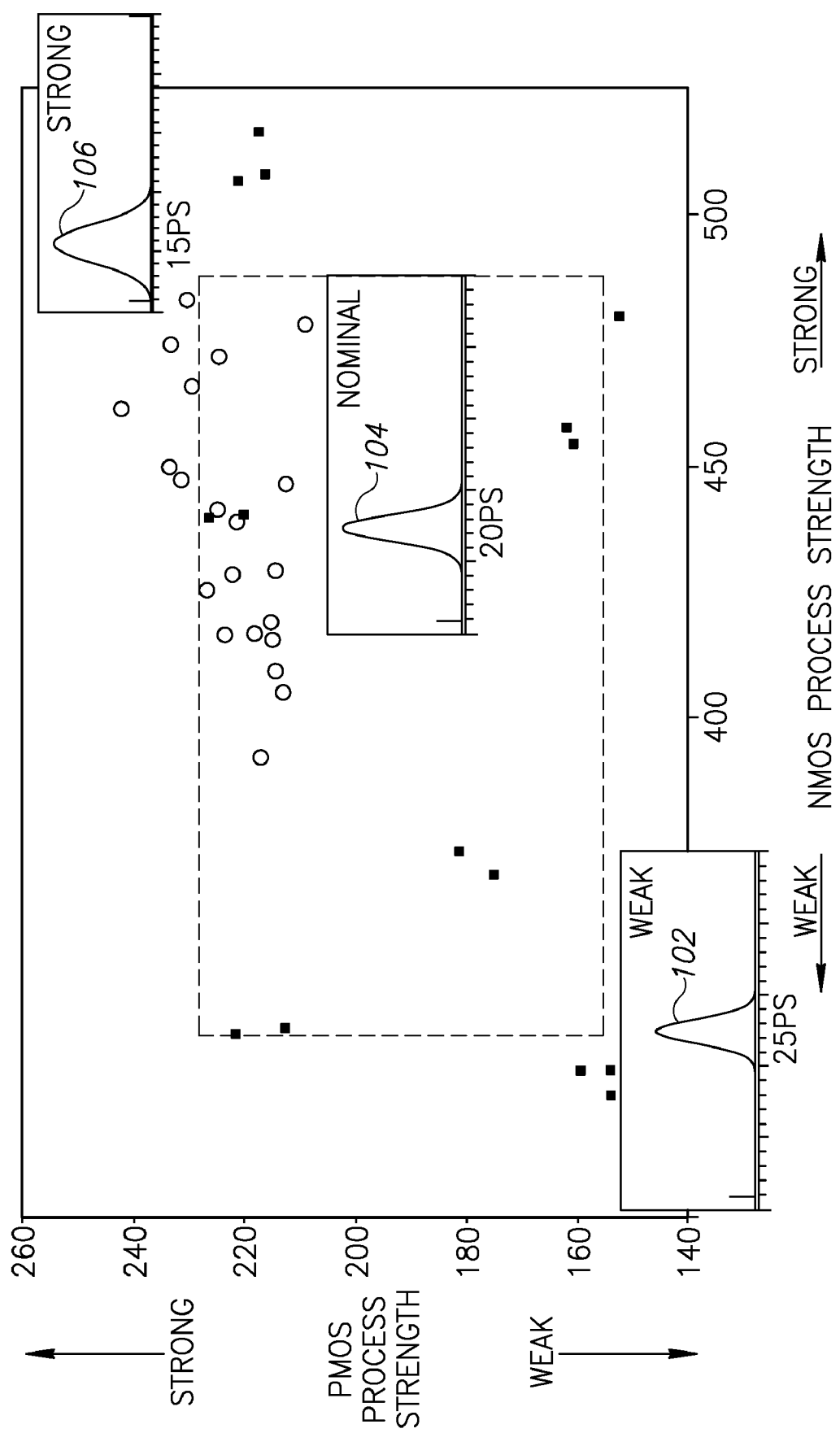
FIG. 7 is a graph illustrating example distributions corresponding to the period inversion per wafer and per die.

A graph illustrating example distributions corresponding to the period inversion per wafer and per die is shown in FIG. 7. In this plot, the x-axis represents NMOS process strength while the y-axis represents PMOS process strength. Special process measurement areas of several wafers were probed and process parameters measured. These are indicated in the Figure as solid dots. Each dot represents measurements from a different wafer. The process corners of these wafers were known a priori. The open circles represent process measurements from a plurality of dies all from the same wafer. These process measurements were obtained using test equipment and probing the dies.

Note the large variation in process corner among the dies from the same wafer. This demonstrates the inadequacy of taking measurements obtained from a few locations on a wafer as representative of all the dies on the wafer. This problem is even more severe in the case of large wafers that comprise thousands of dies. For example, a 300 mm diameter wafer contains over 6,000 dies depending on the size of each die. Thus, due to such a large variation in process across the wafer, determining the process definition for several thousand dies from measurements from a few locations on the wafer is result in inaccurate results and is thus not very reliable.

The present invention overcomes this problem by reading process parameters from every single die using the TDC circuitry on the chip. The three histogram plots 102, 104, 106 correspond to weak, nominal and strong process corners, respectively. In each histogram, the TDC time delay measured on each die is represented on the x-axis with the number of dies with each value is represented on the y-axis. The longer the TDC time delay, the weaker the process. Conversely, the shorter the time delay, the stronger the process. Thus, the weak histogram 102 lies furthest along the x-axis with typical delays of 25 ps. The nominal histogram 104 lies in the middle along the x-axis with typical delays of 20 ps. The strong histogram 106 lies the closest to zero along the x-axis with typical delays of 15 ps.

Burn in and Application of TDC Measurement Data

Figure 8:
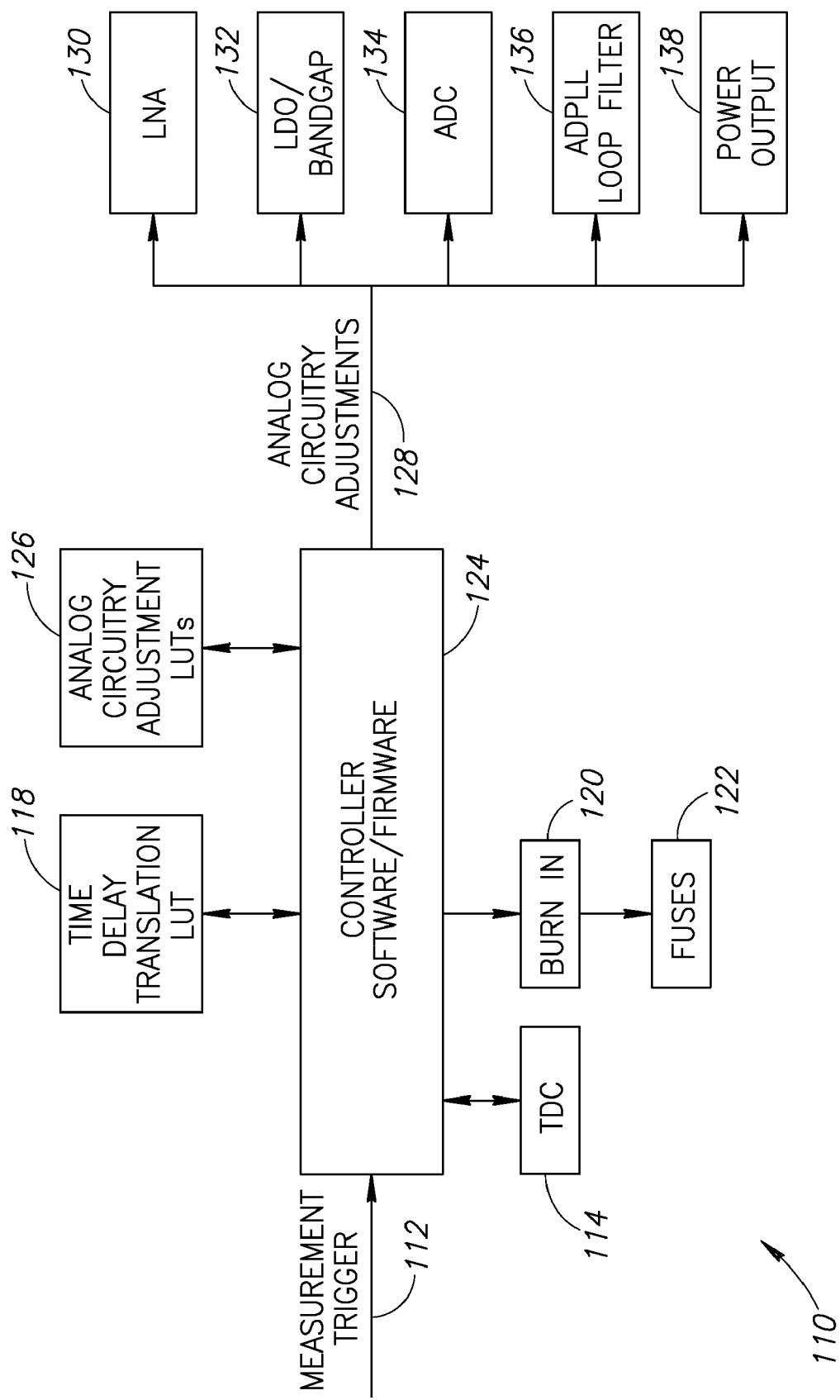
FIG. 8 is a block diagram illustrating the measurement of process information, subsequent processing, burning and application of the process information.

A block diagram illustrating the measurement of process information, subsequent processing, burning and application of the process information is shown in FIG. 8. The process strength measurement and application mechanism, generally referenced 110, comprises the TDC circuit and the associated circuitry for period inversion calculation 114, a translation look up table (LUT) 118, burn in circuit 120, controller 124, a plurality of process strength LUTs 126 and a plurality of analog circuits that are adjusted based on the process strength measurements including, for example, the LNA 130, LDOs and band gaps 132, ADC 134, loop filter in the ADPLL 136 and RF power output circuit 138. Not shown are the bias current and supply voltage adjustment for the DCO, transconductance amplifier (TA) following the LNA. In one embodiment, the measurements are performed at various phases of the IC life cycle, such as on wafer (through probing, or so-called massive multi-site testing that tests 1000s of un-cut dies on the wafer at the same time), after the IC is packaged, after a PCB containing the IC is installed into the phone at the factory, etc.

In operation, the TDC time delay measurement is triggered by some external entity such as a tester during the chip manufacturing process. In response to the trigger 112, the TDC time delay measurement is performed (via controller software/firmware 124) and the post processed results output of the TDC 114 are written to a register. This measurement represents the average delay of the core NMOS and PMOS transistors used in the chip, wherein the delay is inversely proportional to the process strength.

The contents are read by the controller, external test equipment or some other control entity. A time delay translation look up table 118, provided in software, firmware, hardware, etc., is used to determine the process strength, i.e. weak, nominal or strong. A digital value is assigned to the process, '00' for weak, '01' for nominal and '10' for strong. The granularity of the table should preferably be related to the accuracy of the analog device compensation. The contents of an example translation LUT is shown below in Table 1. The contents of the table are typically determined empirically but can be created using any suitable means.

TABLE 1

Translation Look Up Table

| Process | TDC direct measurement | | Calculated delay | | Digital code (binary) |
|---|---|---|---|---|---|
| | Min value (dec) | Max value (dec) | Min delay (ps) | Max delay (ps) | |
| Weak | 1800 | 3000 | 16.8 | 27.9 | 00 |
| Nominal | 1400 | 1800 | 13.0 | 16.8 | 01 |
| Strong | 1000 | 1400 | 9.3 | 13.0 | 10 |

Note that it is appreciated that finer granularity (up to the actual inverter delay value) may be used depending on the particular implementation of the invention. Note also that preferably the time delay measurements for all dies are made at a constant known temperature such as 25 degrees Celsius. Once translated to a digital representation, the process strength data is permanently burned into the chip. This is achieved by a burn in circuit 120 blowing appropriate fuses 122 to permanently fuse the data onto the chip. The 2-bit (or more) process information is burned into the device along with any other desired information such as the serial number, fabrication information, etc. Along with the process information, temperature calibration information is also preferably burned into the device. It should be noted that the process strength information could also be written into a flash or some other nonvolatile memory that will retain the information after power is removed from the chip.

During operation of the chip, the process strength data is read from the chip and used to adjust and tune the analog circuitry located on the chip. In addition, to using the process data previously burned into the chip, the controller can be configured to periodically perform TDC time delay measurements, such as once every second, minute, etc. This permits taking into account variations in process (so-called aging, but aging appears at a much slower rate measured in months or years) and both voltage and temperature in determining any adjustments to be made to the analog circuitry. Temperature can be measured either by temperature measurement circuits placed on the chip or alternatively by performing TDC time delay measurements and comparing the current delay to a previous delay. A current results that is 'hotter' than a previous result indicates that the temperature has increased.

During operation, the controller or other entity retrieves the process data (i.e. the 2-bit or finer process strength indication) from the die and configures the analog circuitry in accordance with parameters characterized previously. These parameters are stored in one or more analog circuitry adjustment LUTs 126. In the example presented herein, three LUTs are needed, one for each of the weak, nominal and strong process strength possibilities. Although in this example, the analog circuitry adjustments are prewired onto the chip, this is not critical. Alternatively, software or firmware can be configured to calculate any required adjustments dynamically. The controller or other entity generates one or more adjustments 128 to be applied to the various analog circuits used through the SoC. Examples of how the process information can be used on a SoC is provided hereinbelow.

Adjustment of LNA:

The process strength data is used to adjust the bias current to fine-tune LNA gain. For a typical LNA, the gain and noise figure performance can be improved by increasing the bias current to the LNA. LNA design is usually optimized for gain, noise figure performance, linearity and current consumption. The performance of the LNA is coupled very tightly with the strength of the underlying process. Knowing the process strength at any point in time is advantageous as it permits the adjustment (i.e. either increase or decrease) of the bias current accordingly. This is achieved by either via a look up table stored in memory on the SoC or by executing an algorithm in software or firmware.

Adjustment of Low Drop Out Regulators and Band Gaps:

The process strength can also be used to adjust the voltage of low-dropout regulators (LDOs) and band gaps; The LDOs and band gap are generally trimmable to provide a precise voltage to the circuits in the IC. This is one of the main 'knobs' that can be used to adjust the analog/RF performance of the each IC circuit. Tables 2, 3 and 4 presented below illustrate an example of how the LDOs and band gap are adjusted based on process strength and temperature. Note that the LDO voltage supply output to digital circuitry could also be adjusted based on the process strength indication in order to reduce static leakage current.

Adjustment of ADC:

The process strength indication can further be used to adjust the setting of the ADC to optimize the noise performance. The overall noise performance of the receiver chain is a combination of the front end (i.e. LNA, TA and mixer) and the back end (i.e. ADC). During the characterization procedure, a full design of experiments (DOE) based on process variation related to the core transistor is performed. Optimal settings for the front end and back end are then determined. These setting are stored in an LUT (or written into an algorithm to calculate the equivalent adjustments) and used in accordance with the process burned into each chip. The adjustments include, for example, increasing the voltage of the low-dropout regulators.

Adjustment of ADPLL Loop Filter:

In addition to the above, the process strength indication can also be used to adjust the bandwidth of the ADPLL loop filter to optimize phase noise performance. An alternative application of the process strength information is to widen-up or narrow-down the bandwidth of the filter loop to optimize the phase noise performance. In many cases a weak process results in non optimal phase noise which degrades the modulation performance of the device. Knowing the process strength (as is the case with the mechanism of the present invention) coupled with an ADPLL with programmable loop bandwidth, the chip firmware is configured to widen the loop bandwidth allowing the PLL to compensate for the added noise. Conversely, the loop bandwidth can be reduced in the case of strong process strength.

Adjustment of Power Output:

The process strength is also used to adjust the RF power output of the device. The output power generated is directly proportional to the strength of the core transistors. The specifications of the output power are usually narrower than the process variation will allow. In order to compensate for the variation in process strength, different settings of the power amplifier (with programmable output power) are set based on the process and temperature measurements. A separate adjustment look up table is used for each process temperature combination.

Note that it is not intended that the invention be limited to the analog circuit parameter adjustments presented herein, as one skilled in the art can apply the process and temperature measurements to parameter adjustments of other analog circuits as well. For example, other parameters that can be adjusted on the fly include any trimmable analog parameters such as input impedance, output impedance, operating frequency, programmable filters, etc.

To aid in illustrating the principles of the present invention, an example of how the process temperature is used for measured weak, nominal and strong process strengths are provided in Tables 2, 3 and 4, respectively, presented below. In each table, the adjustments for several analog circuits are provided for cold, cool, room, warm and hot temperatures. The adjustments include: LNA boost, LNA trim, I and V band gap trim, baseband LDO high voltage trim, RFIO LDO trim and output power (particular output power table indicated).

TABLE 2

Analog and RF Circuit Adjustment
Look Up Table for Weak Process

| Temperature | Description | Value |
|---|---|---|
| Cold | LNA Boost | off |
| | LNA Trim | use initial value |
| | BGAP I-Trim | no change |
| | BGAP V-Trim | no change |
| | BBLDO trim_high_volt | no change |
| | RFIO LDO | use initial value |
| | Power Table | use initial value |
| Cool | LNA Boost | off |
| | LNA Trim | use initial value |
| | BGAP I-Trim | no change |
| | BGAP V-Trim | no change |
| | BBLDO trim_high_volt | no change |
| | RFIO LDO | increase three levels |
| | Power Table | decrease one level |
| Room | LNA Boost | Off |
| | LNA Trim | increase one level |
| | BGAP I-Trim | no change |
| | BGAP V-Trim | no change |
| | BBLDO trim_high_volt | no change |
| | RFIO LDO | use initial value |
| | Power Table | use initial value |
| Warm | LNA Boost | off |
| | LNA Trim | increase two levels |
| | BGAP I-Trim | no change |
| | BGAP V-Trim | no change |
| | BBLDO trim_high_volt | increase two levels |
| | RFIO LDO | increase three levels |
| | Power Table | increase one level |
| Hot | LNA Boost | On |
| | LNA Trim | use initial value |
| | BGAP I-Trim | no change |
| | BGAP V-Trim | no change |
| | BBLDO trim_high_volt | increase three levels |
| | RFIO LDO | increase three levels |
| | Power Table | increase three levels |

TABLE 3

Analog and RF Circuit Adjustment
Look Up Table for Nominal Process

| Temperature | Description | Value |
|---|---|---|
| Cold | LNA Boost | off |
| | LNA Trim | use initial value |
| | BGAP I-Trim | no change |
| | BGAP V-Trim | no change |
| | BBLDO trim_high_volt | no change |
| | RFIO LDO | decrease one level |
| | Power Table | decrease one level |
| Cool | LNA Boost | off |
| | LNA Trim | use initial value |
| | BGAP I-Trim | no change |

TABLE 3-continued

Analog and RF Circuit Adjustment
Look Up Table for Nominal Process

| Temperature | Description | Value |
|---|---|---|
| | BGAP V-Trim | no change |
| | BBLDO trim_high_volt | no change |
| | RFIO LDO | decrease one level |
| | Power Table | decrease one level |
| Room | LNA Boost | off |
| | LNA Trim | use initial value |
| | BGAP I-Trim | no change |
| | BGAP V-Trim | no change |
| | BBLDO trim_high_volt | no change |
| | RFIO LDO | use initial value |
| | Power Table | use initial value |
| Warm | LNA Boost | off |
| | LNA Trim | increase one levels |
| | BGAP I-Trim | no change |
| | BGAP V-Trim | no change |
| | BBLDO trim_high_volt | no change |
| | RFIO LDO | increase two levels |
| | Power Table | increase one level |
| Hot | LNA Boost | off |
| | LNA Trim | increase two levels |
| | BGAP I-Trim | no change |
| | BGAP V-Trim | no change |
| | BBLDO trim_high_volt | increase one level |
| | RFIO LDO | increase three levels |
| | Power Table | increase three levels |

TABLE 4

Analog and RF Circuit Adjustment
Look Up Table for Strong Process

| Process | Description | Value |
|---|---|---|
| Cold | LNA Boost | off |
| | LNA Trim | use initial value |
| | BGAP I-Trim | no change |
| | BGAP V-Trim | no change |
| | BBLDO trim_high_volt | no change |
| | RFIO LDO | decrease one level |
| | Power Table | decrease three levels |
| Cool | LNA Boost | off |
| | LNA Trim | use initial value |
| | BGAP I-Trim | no change |
| | BGAP V-Trim | no change |
| | BBLDO trim_high_volt | no change |
| | RFIO LDO | decrease one level |
| | Power Table | decrease one level |
| Room | LNA Boost | off |
| | LNA Trim | use initial value |
| | BGAP I-Trim | no change |
| | BGAP V-Trim | no change |
| | BBLDO trim_high_volt | no change |
| | RFIO LDO | use initial value |
| | Power Table | use initial value |
| Warm | LNA Boost | off |
| | LNA Trim | increase one level |
| | BGAP I-Trim | no change |
| | BGAP V-Trim | no change |
| | BBLDO trim_high_volt | no change |
| | RFIO LDO | use initial value |
| | Power Table | use initial value |
| Hot | LNA Boost | off |
| | LNA Trim | increase two levels |
| | BGAP I-Trim | no change |
| | BGAP V-Trim | no change |
| | BBLDO trim_high_volt | no change |
| | RFIO LDO | increase three levels |
| | Power Table | increase one level |

Other on-chip detection methods could also be used in addition to the inverter delay estimation obtained using the TDC period inversion. For example, the DCO gain or frequency step estimation method described in U.S. Publication No. 2003/0133522A1, published Jul. 17, 2003, to Staszewski et al., entitled "All-Digital Frequency Synthesis With DCO Gain Calculation," incorporated herein by reference in its entirety, correlates well with certain aspects of the process strength. Since the DCO tracking bank varactors of the specific embodiment are built using PMOS devices, the DCO gain estimation better correlates with analog and RF devices built using PMOS transistors. Depending on a specific situation, one of the detection methods or their weighted combination is preferred.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of compensating a plurality of analog and radio frequency (RF) circuits for integrated circuit process variation, said method comprising the steps of:
    measuring a time delay of an inverter fabricated on said integrated circuit;
    generating a digital indication of process variation corresponding to said time delay;
    permanently burning said digital indication into said integrated circuit; and
    reading said digital indication and adjusting settings of said analog and RF circuits in accordance with said digital indication.

2. The device according to claim 1, wherein said inverter is part of a time to digital converter (TDC) circuit.

3. The device according to claim 1, wherein said digital indication comprises a 2-bit number adapted to indicate one of three possible indications, including weak, nominal and strong process corner.

4. A System on a Chip (SoC), comprising:
    an inverter chain fabricated on said SoC;
    a time delay measurement circuit operative to measure a cell time delay of said inverter chain;
    a burn in circuit operative to generate a digital indication of process variation corresponding to said time delay and to permanently burn said digital indication into said SoC;
    means for retrieving said burned-in digital indication of process variation;
    and
    means for periodically obtaining updated time delay measurements from said time delay measurement circuit and for comparing said updated time delay measurements with previous time delay measurements to yield an indication of current temperature therefrom.

5. The SoC according to claim 4, wherein said digital inverter chain comprises a time to digital converter (TDC) circuit.

6. The device according to claim 4, wherein said digital indication comprises a 2-bit number adapted to indicate one of three possible indications, including weak, nominal and strong process variation.

7. A process strength measurement device, comprising:
    an inverter chain normally operative to determine a delay difference between a reference clock and a high speed clock;
    a normalization circuit operative to accumulate said delay difference over a plurality of reference clock cycles to yield an average delay difference; and
    means for calculating a measure of process strength as a function of said average fractional delay difference.

8. The device according to claim 7, wherein said means for calculating comprises means for comparing said average delay differences against desired thresholds for weak, baseline and strong process variations thereby providing said measure of process strength.

9. An apparatus for measuring process variation in an all digital phase locked loop (ADPLL), comprising:
    a time to digital converter (TDC) circuit comprising a chain of inverters operative to generate a plurality of clock delay difference measurements; and
    means for generating an indication of process strength as a function of said plurality of clock delay difference measurements;
    wherein said means for generating comprises means for comparing said plurality of clock delay difference measurements against desired thresholds for weak, baseline and strong process variations.

10. An apparatus for measuring process variation in a digital RF processor (DRP) having a clock retiming circuit including an inverter chain and corresponding registers for comparing a system clock and a reference clock, comprising:
    means for reading said registers in said clock retiming circuit and determining an inverter delay therefrom; and
    outputting retiming data which is directly proportional to process variation of core transistors making up said DRP.

11. A method of directly measuring process variation in a device incorporating a time to digital converter (TDC) circuit, said method comprising the steps of:
    determining a number of transistors activated in a chain of inverters which matches the retiming of an external reference clock;
    translating said number of transistors activated to an inverter delay period corresponding to said transistors; and
    correlating said inverter delay period to yield a measurement of process variation.

* * * * *